(12) United States Patent
Ivaldi

(10) Patent No.: US 6,507,390 B1
(45) Date of Patent: Jan. 14, 2003

(54) METHOD AND APPARATUS FOR A RETICLE WITH PURGED PELLICLE-TO-RETICLE GAP

(75) Inventor: Jorge Ivaldi, Trumbull, CT (US)

(73) Assignee: ASML US, Inc., Wilton, CT (US)

( * ) Notice: Subject to any disclaimer, the term of this patent is extended or adjusted under 35 U.S.C. 154(b) by 0 days.

(21) Appl. No.: 09/501,180

(22) Filed: Feb. 10, 2000

(51) Int. Cl.[7] .................. G03B 27/62; G03B 27/32; A47G 1/12
(52) U.S. Cl. .................. 355/75; 355/77; 428/14
(58) Field of Search .................. 355/75, 76, 77; 428/14; 206/454

(56) References Cited

U.S. PATENT DOCUMENTS

| | | | |
|---|---|---|---|
| 4,719,705 A | 1/1988 | Laganza et al. | 33/568 |
| 4,986,007 A | 1/1991 | Laganza et al. | 33/621 |
| 5,727,685 A | 3/1998 | Laganza et al. | 206/455 |
| 5,814,381 A | * 9/1998 | Kuo | 428/14 |
| 6,216,873 B1 | * 4/2001 | Fosnight et al. | 206/454 |

OTHER PUBLICATIONS

*Thomas Register, Companies Found, Search Path: porous: Metals; Porous: 38 companies found* (visited Dec. 27, 1999) ≦http://www5.thomasregister.com>, 2 pages.
*Filter Technology: Functional porosity for high–performance applications* (visited Dec. 27, 1999) <http://www.gknsintermetals.com/filter_technology.html>, 2 pages.

* cited by examiner

Primary Examiner—Alan A. Mathews
Assistant Examiner—Peter B. Kim
(74) Attorney, Agent, or Firm—Sterne, Kessler, Goldstein & Fox, P.L.L.C.

(57) ABSTRACT

A method and apparatus for maintaining a purged optical gap between a pellicle and a reticle in a photolithography system is described. A porous frame between a reticle and a pellicle maintains the purged optical gap. A porous frame includes a first and a second opposing surface. The first opposing surface defines a first opening, and is configured to mate with the pellicle. The second opposing surface defines a second opening, and is configured to mate with the reticle to enclose the optical gap between the pellicle and the reticle. A gas supply interface infuses a purge gas through the porous frame and into the gap.

28 Claims, 4 Drawing Sheets

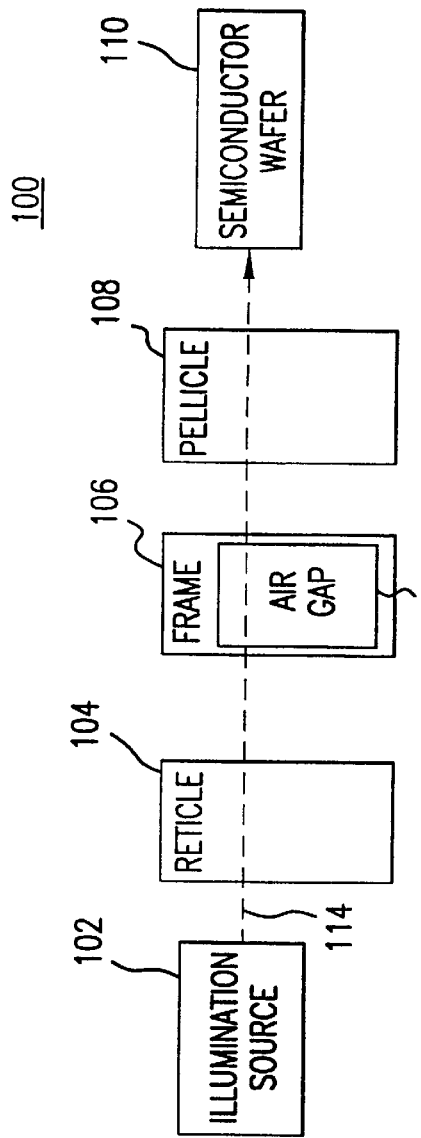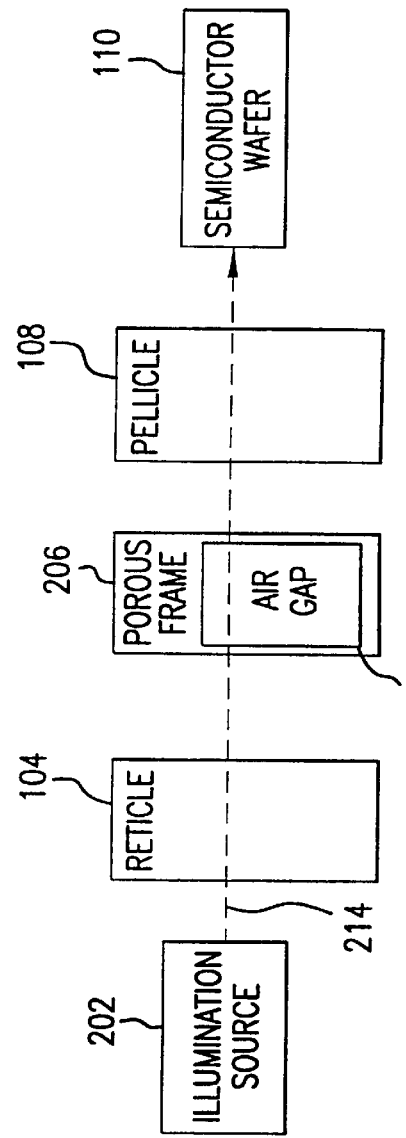

METHOD AND APPARATUS FOR A RETICLE WITH PURGED PELLICLE-TO-RETICLE GAP

BACKGROUND OF THE INVENTION

1. Field of the Invention

The present invention is generally related to photolithography systems, and more particularly, to maintaining an oxygen-purged optical path through a reticle and pellicle.

2. Related Art

In the fabrication of integrated circuits, photolithographic and projection printing techniques are used. In photolithography, an image contained on a reticle is projected onto a wafer having a photosensitive resist thereon. The reticle or mask is used to transfer a desired image onto the silicon wafer. The semiconductor wafer surface is coated with photosensitive resist so that an image is etched thereon. A pellicle may be used in combination with the reticle to protect the reticle surface from damage. The pellicle is traditionally mounted on a solid frame to the reticle.

Some wavelengths of light used in photolithography are sensitive to absorption by atmospheric oxygen. Hence, when such oxygen-sensitive light wavelengths are used in photolithography, they must be transmitted through an oxygen-purged atmosphere.

A photolithography system is typically located in a clean room environment. In some situations, the ambient atmosphere of the clean room cannot be purged of oxygen because this may cause other problems with the photolithography process. For instance, a laser interferometer used in a lithography system may be sensitive to changes in the index of refraction of the air, which may occur with a change to an oxygen-free atmosphere. Hence, the oxygen-free environment may have to be restricted to less than the entire lithography system. What is needed is a transmission medium for light wavelengths that have high absorption in an oxygen-containing environment.

A pellicle is generally mounted on a frame opposite a corresponding reticle. Hence, an air gap may exist between the reticle and pellicle. What is needed is a transmission medium through the reticle-to-pellicle air gap for light wavelengths that have high absorption in an oxygen-containing environment.

SUMMARY OF THE INVENTION

The present invention is directed to a method and apparatus for a reticle with a purged pellicle-to-reticle gap. The present invention maintains a substantially oxygen-free, purge gas environment in a pellicle-to-reticle gap. The purge gas environment provides a transmission medium for light wavelengths that have high absorption in a non-purged environment.

In a preferred embodiment, the present invention is applied to a photolithography system. A porous frame between a reticle and a pellicle creates a gap or space between the reticle and pellicle. The porous frame may passively filter ambient air entering the gap through the porous frame to create a substantially particle-free gap. The particulate protection is required to ensure that particles do not deposit on the critical reticle surface, degrading the reticle image projected onto a semiconductor wafer surface. This includes protection during storage of the reticle and usage of the reticle in a lithographic process.

The passive or static porous frame acts to normalize the pressure within the reticle to pellicle gap with the external ambient air atmosphere. This normalization action effectively reduces or eliminates distortion of either the reticle and/or pellicle due to atmospheric pressure.

The porous frame includes a first opposing surface with a first opening. The first opposing surface is configured to mate with the pellicle. The porous frame includes a second opposing surface with a second opening. The second opposing surface is configured to mate with the reticle to enclose the optical gap between the pellicle and the reticle.

A purged reticle to pellicle gap may be formed by filling the gap with a purge gas that does not contain oxygen. The purge gas in the gap may be maintained dynamically by continuously infusing the purge gas.

A dynamic porous frame may be coupled to a purge gas supply. The purge gas supply inserts a purge gas into the gap between the reticle and pellicle through the porous frame, establishing a purge gas flow in the gap within the porous frame.

A vacuum source may be coupled to the dynamic porous frame to remove gas from the reticle-to-pellicle gap environment through the porous frame, further providing continuous gas flow in the reticle.

The purge gas flow in the gap of a dynamic porous frame may be balanced with an external atmospheric pressure to reduce or eliminate reticle or pellicle distortions.

The porous frame of the present invention is applicable to other environments, including other optical environments. In an example alternative optical embodiment, the porous frame can provide a purged optical path between any optical source surface and any optical target surface. The optical source surface and optical target surface may be any suitable optical surfaces known to persons skilled in the relevant art(s).

Further embodiments, features, and advantages of the present inventions, as well as the structure and operation of the various embodiments of the present invention, are described in detail below with reference to the accompanying drawings.

BRIEF DESCRIPTION OF THE FIGURES

In the drawings, like reference numbers generally indicate identical, functionally similar, and/or structurally similar elements. The drawing in which an element first appears is indicated by the left-most digit(s) in the corresponding reference number.

FIG. 1 illustrates a block diagram of the relevant portion of the optical path of a conventional lithography system.

FIG. 2 illustrates a block diagram of the relevant portion of the optical path of a lithography system of the current invention.

DETAILED DESCRIPTION OF THE PREFERRED EMBODIMENTS

Figure 3:
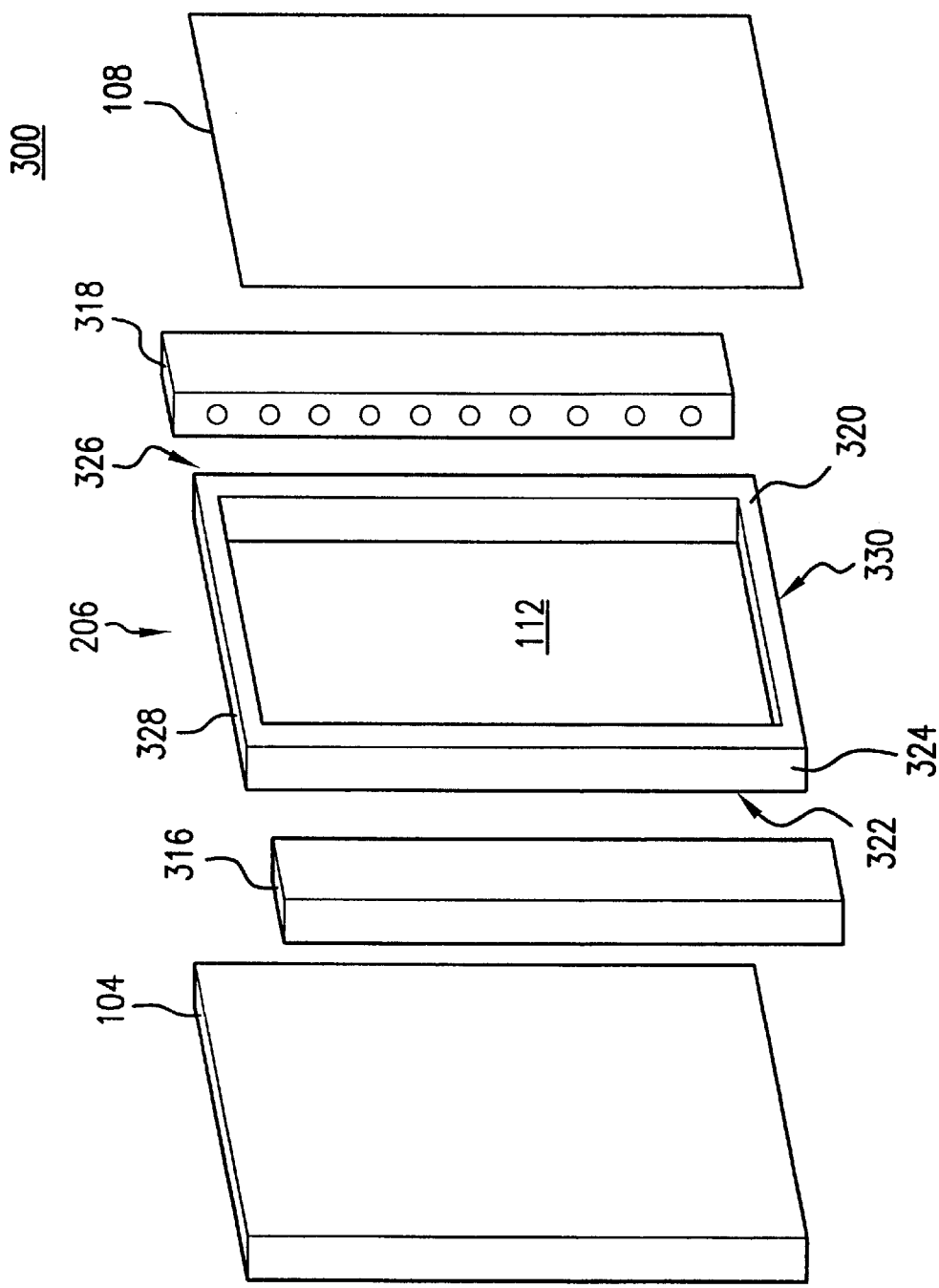
FIG. 3 illustrates an exploded view of a reticle and pellicle assembly with porous frame, according to an embodiment of the present invention.

To more clearly delineate the present invention, an effort is made throughout the specification to adhere to the following term definitions as consistently as possible.

"Ambient air" means an oxygen-containing atmosphere, such as normal atmospheric air. For instance, "ambient air"

may mean air in an oxygen-containing clean room atmosphere or environment.

"Purge gas" means a gas that does not contain oxygen, or some other undesired gas, and is used to fill a purged air gap or space.

FIG. 1 illustrates a relevant portion of a conventional photolithography system 100. Conventional photolithography system 100 is located in an ambient air or gas environment. Some portions of a conventional photolithography system may not be shown in FIG. 1 for purposes of brevity, such as source optics, projection optics, etc.

Conventional photolithography system 100 comprises an illumination source 102, a reticle 104, a frame 106, a pellicle 108, and a semiconductor wafer 110.

Illumination source 102 includes a source of radiation for exposing a surface of semiconductor wafer 110 with a pattern on reticle 104.

Reticle 104 includes a mask with a pattern that is transferred to a surface of semiconductor wafer 110 by radiation from illumination source 102.

Frame 106 is a conventional solid frame to which the reticle and pellicle are attached. Frame 106 comprises an air gap 112. Air gap 112 is formed within frame 106 between reticle 104 and pellicle 108.

Pellicle 108 is a clear cover for protecting reticle 104 from particulate damage.

Semiconductor wafer 110 is a semiconductor wafer with a surface to be exposed and etched by radiation from illumination source 102 with a pattern from reticle 104.

Illumination source 102 produces radiation 114. Radiation 114 is transmitted through reticle 104, frame 106, air gap 112, and pellicle 108, to a surface of semiconductor wafer 110. When radiation 114 includes light wavelengths that are absorbed by oxygen, oxygen in air gap 112 may absorb at least a portion of these wavelengths, potentially preventing a sufficient amount of radiation 114 from reaching the surface of semiconductor wafer 110. This absorption may lead to an inadequate amount of radiation transferring the pattern of reticle 104 to the surface of semiconductor wafer 110, leading to reduced semiconductor wafer yields.

FIG. 2 illustrates an exemplary photolithography system 200, according to an embodiment of the present invention. Photolithography system 200 is located in an ambient air environment. Photolithography system 200 maintains a purge gas environment between a reticle and a pellicle for transmission of light wavelengths that are sensitive to oxygen.

Photolithography system 200 comprises an illumination source 202, a reticle 104, a porous frame 206, a pellicle 108, and a semiconductor wafer 110.

Illumination source 202 includes a source of radiation for exposing a surface of semiconductor wafer 110. Illumination source 202 may include any applicable source of radiation suitable for exposing a semiconductor wafer surface, including a laser. Illumination source 202 transmits radiation 214. Radiation 214 may include any type of suitable radiation, including laser light. Radiation 214 may include oxygen-sensitive light wavelengths suitable for exposing and etching a semiconductor wafer. Such light wavelengths may include 157 nm wavelength light, for example.

Reticle 104 receives radiation 214. Reticle 104 includes a mask with a pattern that is transferred to a surface of semiconductor wafer 110 by radiation 214 from illumination source 202.

Porous frame 206 receives radiation 214 that has passed through reticle 104. Reticle 104 is attached to porous frame 206. Porous frame 206 comprises a porous material that allows gas to flow through, but blocks passage of particle contaminants.

Pellicle 108 receives radiation 214 that has passed through porous frame 206. Pellicle 108 is attached to porous frame 206. Reticle 104 is in optical alignment with pellicle 108.

Radiation 214 is transmitted through reticle 104, porous frame 206, purge air gap 112, and pellicle 108 to semiconductor wafer 110. Semiconductor wafer 110 receives radiation 214. Semiconductor wafer 110 comprises a surface to be exposed and etched with a pattern of reticle 104 by radiation 214 transmitted by illumination source 202.

Porous frame 206 encloses air gap 112. Air gap 112 is formed within porous frame 206 between reticle 104 and pellicle 108. Air gap 112 may be filled with a purge gas, such as nitrogen, that does not contain oxygen, and hence does not interfere with oxygen-sensitive wavelengths of radiation 214. Porous frame 206 further prevents particulate contamination from entering air gap 112 and damaging reticle 104. Porous frame 206 has sufficient porosity to allow gas to pass from air gap 112 enclosed by porous frame 206 to an exterior of porous frame 206.

Because porous frame 206 allows gas to flow in and out, in a static mode, porous frame 206 normalizes pressure within air gap 112 with atmospheric pressure, eliminating distortion to reticle 104 and/or pellicle 108.

Lithography system 200 provides a purge gas optical path for radiation 214 from illumination source 202. Hence, illumination source 202 may transmit oxygen-sensitive light wavelengths, without suffering from significant attenuation caused by oxygen absorption.

The reticle with purged pellicle-to-reticle gap of the present invention is described above in an example photolithography environment. The present invention is not limited to such an environment, and is applicable to additional photolithography environments, and non-photolithography environments. The example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary embodiments for a reticle with purged pellicle-to-reticle gap according to the present invention are described below. These embodiments are described herein for illustrative purposes, and are not limiting. The present invention is adaptable to any application requiring a reticle with purged pellicle-to-reticle gap.

FIG. 3 illustrates an exploded view of an exemplary purged pellicle-to-reticle gap system 300, according to an embodiment of the present invention. Purged pellicle-to-reticle gap system 300 comprises a reticle 104, a porous frame 206, a pellicle 108, an air gap 112, a purge gas supply interface 316, and a vacuum source interface 318.

Porous frame 206 comprises a first open surface 320 and a second open surface 322 (located on opposite side of porous frame 206 from first open surface 320, not visible in FIG. 3). First open surface 320 and second open surface 322 are substantially parallel to one another. Porous frame 206 is comprised of a porous filtering material. The porous filtering material of porous frame 206 allows the transmission of gases, but prevents the transmission of particles. These particles may include particles in the air, dust, particles resulting from the photolithography process, and particles resulting from other sources. In a preferred embodiment, porous frame 206 is substantially rectangular. In alternate embodiments, porous frame 206 may comprise other shapes, such as circular, elliptical, and irregular.

In a preferred embodiment, porous frame 206 is manufactured from one or more metals. For example, porous frame 206 may comprise iron, copper, bronze, nickel, titanium, or other metal, or any combination or alloy thereof. Porous frame 206 comprises pores formed in the metal(s) by a pore forming process. For example, porous frame 206 may be made from metal powder particles or filaments bonded at their contact points by sintering, which may create a continuous, well-defined network of pores between the particles or filaments. Sintering techniques generally weld together and grow a contact area between two or more initially distinct particles at temperatures below the melting point. Other processes for forming pores are also within the scope of the present invention. The porosity, or pore size, may be controlled by the production process, and may be determined on an application-by-application basis. For example, the porosity may be specified in microns, or in fractions of a micron. The invention, however, is not limited to these porosity values. A number of vendors can potentially supply suitable porous metals that are manufactured according to sintering and other techniques. Such vendors may include GKN Sinter Metals, in Auburn Hills, Mich., and Capstan Permaflow, Inc., in Gardena, Calif.

Pellicle 108 is coupled to first open surface 320 of porous frame 206. Pellicle 108 may comprise a glass, a membrane, or other material, as would be known to persons skilled in the relevant art(s). Pellicle 108 is attached or affixed to first open surface 320 such that air gap 112 is completely enclosed at first open surface 320. Furthermore, pellicle 108 is attached to first open surface 320 such that a substantially air tight seal is formed at the interface of pellicle 108 and first open surface 320. Pellicle 108 and first open surface 320 are attached in a manner well known to persons skilled in the relevant art(s). For example, pellicle 108 may be glued to first open surface 320.

Reticle 104 is coupled to second open surface 322 of porous frame 206. Reticle 104 is attached or affixed to second open surface 322 such that air gap 112 is completely enclosed at second open surface 322. Furthermore, reticle 104 is attached to second open surface 322 such that a substantially air tight seal is formed at the interface of reticle 104 and second open surface 322. Reticle 104 and second open surface 322 are attached in a manner well known to persons skilled in the relevant art(s).

Pellicle 108, reticle 104, and porous frame 206 combine to form a substantially air tight air gap 112, where gases flow only through the material of porous frame 206. In a preferred embodiment, the porous filtering material of porous frame 206 is capable of allowing transmission of a gas while simultaneously blocking the entrance of particulate contamination.

The "breathable" porous frame 206 assembly with reticle 104 and pellicle 108 may either be allowed to remain static (i.e. open to the surrounding environment), or be coupled to an external pressurized purge gas source as described above. Purge gas supply interface 316 interfaces porous frame 206 with a purge gas supply. Purge gas supply interface 316 connects to a first frame end surface 324 of porous frame 206. Purge gas supply interface 316 preferably provides a purge gas from a purge gas supply to first frame end surface 324. The purge gas infuses from purge gas supply interface 316 into air gap 112 through the pores of first frame end surface 324. In an alternative embodiment, purge gas supply interface 316 is a first port, hole, or valve in porous frame 206 for providing purge gas through porous frame 206 and into air gap 112.

Vacuum source interface 318 interfaces porous frame 206 with a vacuum source. Vacuum source interface 318 connects to a second frame end surface 326 of porous frame 206. As shown in FIG. 3, second frame end surface 326 is located on the opposite side of porous frame 206 from first frame end surface 324 (not visible in FIG. 3). In alternate embodiments, second frame end surface 326 may be located on sides of porous frame 206 that are not opposite first frame end surface 324. Vacuum source interface 318 preferably evacuates or removes the purge gas from air gap 112 through the pores of second frame end surface 326. In an alternative embodiment, vacuum source interface 318 is a second port, hole, or valve in porous frame 206 for evacuating or removing purge gas more directly from air gap 112.

In normal operation, porous frame 206 has four exposed outer surfaces: first frame end surface 324, second frame end surface 326, a third frame end surface 328, and a fourth frame end surface 330 (opposite of third frame end surface 328, not visible in FIG. 3). In a preferred embodiment, all exposed outer surfaces of porous frame 206 are porous, and allow gas to pass into and out from air gap 112. In alternative embodiments, first frame end surface 324 and second frame end surface 326 are the only exposed outer surfaces of porous frame 206 that are porous. This is especially useful in dynamic uses of the present invention, allowing porous frame 206 to be coupled to a purge gas source and vacuum source at first frame end surface 324 and second frame end surface 326, respectively, with no remaining exposed surfaces to leak gas.

Purge gas may enter the assembly via purge gas supply interface 316, and be evacuated from the assembly via vacuum source interface 318 to create a continuous flow of purge gas through air gap 112. The purge gas flow through air gap 112 is balanced to be equal to atmospheric pressure, to eliminate distortion to reticle 104 and/or pellicle 108.

Exemplary embodiments of a reticle with purged pellicle-to-reticle gap of the present invention are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary operational and/or structural implementations related to the structure(s), and/or embodiments described above are presented in this section. These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 4:
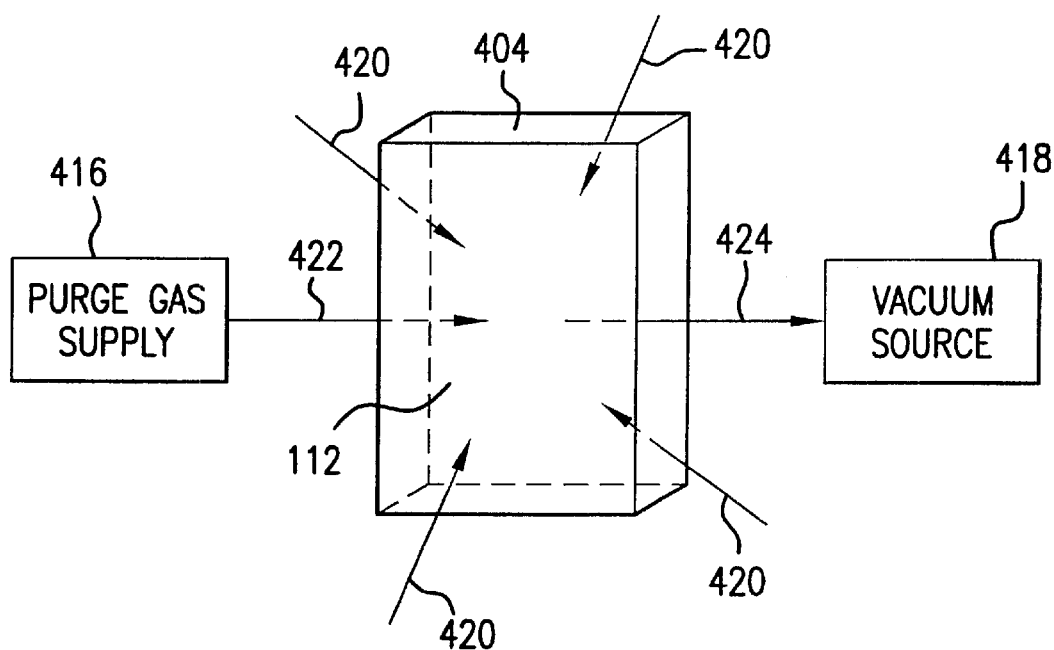
FIG. 4 illustrates operation of an exemplary embodiment of the present invention.

FIG. 4 illustrates operation of an exemplary embodiment of the present invention. FIG. 4 shows a porous frame reticle/pellicle assembly 404, a purge gas supply 416, and a vacuum source 418.

In a preferred embodiment, porous frame reticle/pellicle assembly 400 comprises a reticle, a porous frame, and a pellicle, such as reticle 104, porous frame 206, and pellicle 108 shown in FIG. 3. Porous reticle/pellicle assembly 400 further comprises an air gap 112.

In a preferred embodiment, porous frame reticle/pellicle assembly 404 maintains mechanical particulate control on a critical surface of the reticle, while allowing a continuous purge gas or air environment flow in air gap 112. Furthermore, porous reticle/pellicle assembly 400 normalizes the pressure within air gap 112, effectively eliminating distortion of either the reticle or pellicle due to atmospheric pressure changes.

In embodiments, the porous filtering material of porous frame 206 is capable of allowing transmission of a gas while simultaneously blocking the entrance of particulate contamination. This "breathable" porous frame reticle/pellicle assembly 400 may be allowed to remain static (i.e. open to the surrounding environment). In a static embodiment, porous frame reticle/pellicle assembly 400 is not coupled to a purge gas supply 416 or a vacuum source 418. Ambient air may be allowed to enter air gap 112 through porous frame reticle/pellicle assembly 400, as in example ambient air flow paths 420. However, in a preferred embodiment described below, a continuous flow of purge gas is injected into air gap 112 to prevent ambient air from entering air gap 112.

Porous frame reticle/pellicle assembly 400 may also operate in a dynamic environment. In a dynamic embodiment, porous frame reticle/pellicle assembly 400 may be coupled to a purge gas supply 416. Purge gas supply 416 supplies a purge gas through a porous frame of porous frame reticle/pellicle assembly 400 to air gap 112. The purge gas entering air gap 112 is shown as inserted purge gas flow 422. Suitable gas supply systems for purge gas supply 416 are well known in the art.

Furthermore in a dynamic embodiment, porous frame reticle/pellicle assembly 400 may be coupled to a vacuum source 418. Vacuum source 418 removes purge gas and/or ambient environment gas (if present) from air gap 112 through a porous frame of porous frame reticle/pellicle assembly 400. Purge gas being removed from air gap 112 is shown as removed gas flow 424. Suitable vacuum systems for use as vacuum source 418 are well known in the art.

Flowcharts are provided that detail operational steps of an example embodiment of the present invention. The steps provided do not necessarily have to occur in the order shown, as will be apparent to persons skilled in the relevant art(s) based on the teachings herein. Other structural and operational embodiments will be apparent to persons skilled in the relevant art(s) based on the discussion contained herein. These steps are described in detail below.

Figure 5:
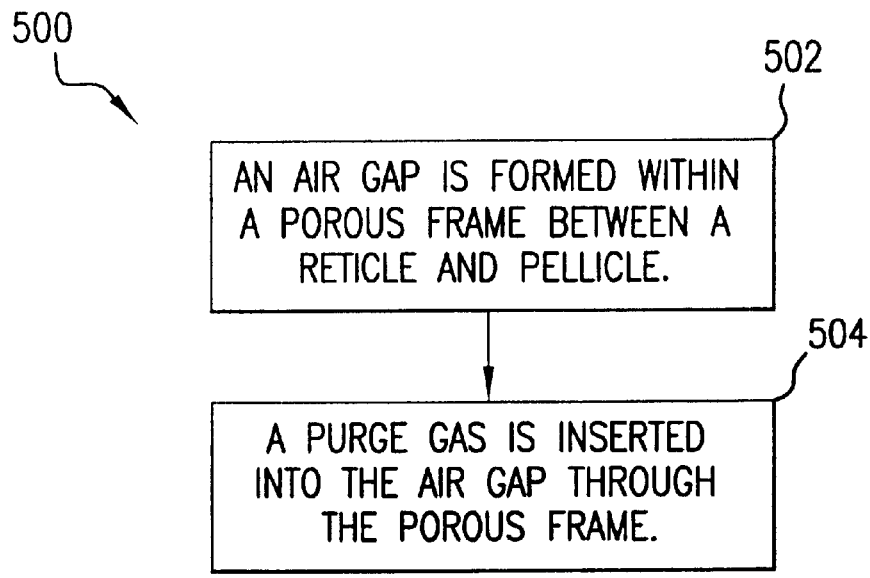
FIGS. 5 and 6 illustrate flowcharts providing operational steps for embodiments of the present invention.

FIG. 5 illustrates a flowchart providing operational steps for an embodiment of the present invention. A process 500 shown in FIG. 5 begins with step 502. In step 502, an air gap is formed within a porous frame between a reticle and pellicle. In step 504, a purge gas is inserted into the air gap through the porous frame.

Figure 6:
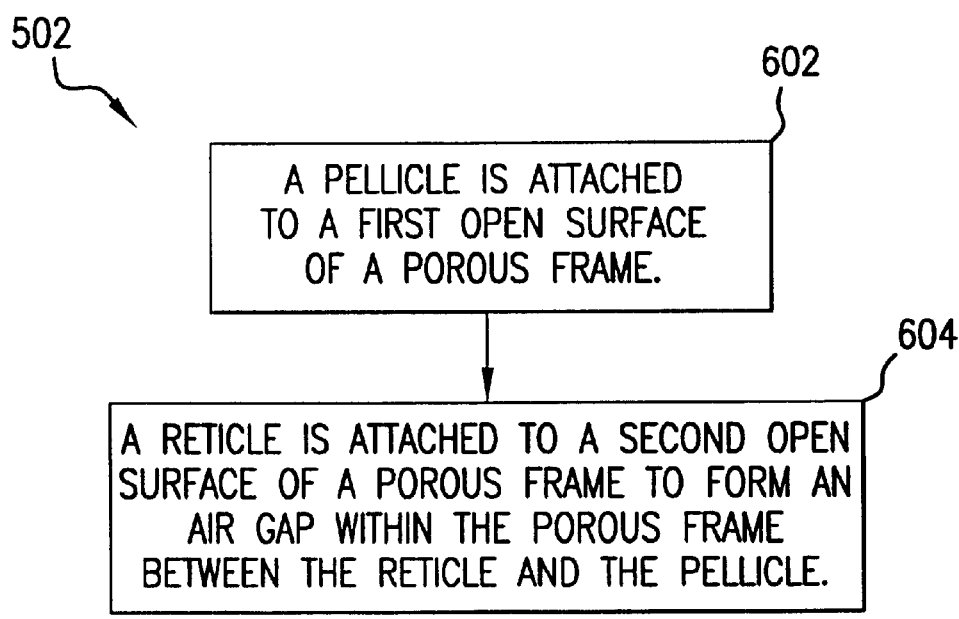

FIG. 6 illustrates a flowchart providing exemplary detailed operational steps for step 502 of FIG. 5. In step 602, a pellicle is attached to a first open surface of a porous frame. In step 604, a reticle is attached to a second open surface of a porous frame to form an air gap within the porous frame between the reticle and the pellicle.

Process 500 of FIG. 5 may further include a step where the inserted purge gas is filtered by the porous frame.

Step 504 may include a step where a purge gas is inserted into the air gap through an end surface of the porous frame.

Process 500 may further include a step where the purge gas is removed from the air gap. This step may include a step where the purge gas is removed from the air gap through a frame end surface of the porous frame.

Process 500 may further include a step where a purge gas pressure in the air gap is balanced with an ambient environment air pressure.

In an alternative embodiment, a purge gas pressure in air gap 112 is maintained to exceed an ambient environment air pressure. By allowing the purge gas pressure in air gap 112 to exceed the ambient environment air pressure, a substantially oxygen-purged air gap 112 may be maintained. A purge gas supply 416 inserts a purge gas into air gap 112. The purge gas is inserted at a rate such that the purge gas pressure in air gap 112 exceeds the ambient environment air pressure, and hence, the purge gas will leak out of air gap 112 through porous frame 206. The purge gas is inserted at a rate slowly enough so as not to cause substantial distortion to reticle 104 and/or pellicle 208. The purge gas leaking out of air gap 112 through porous frame 206 substantially impedes the ability of ambient air to leak into air gap 112 through porous frame 206. In this alternative embodiment, a vacuum source 418 is not needed to remove the purge gas, because the purge gas leaks out of air gap 112 through porous frame 206.

Additional steps or enhancements to the above processes and steps which may become known to persons skilled in the relevant art(s) from the teachings herein are also encompassed by the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus for providing a purged optical path between an optical source surface and an optical target surface, comprising:

a porous frame defining first and second opposing surfaces, said first opposing surface defining a first opening and being configured to mate with the optical source surface and said second opposing surface defining a second opening and being configured to mate with the optical target surface to enclose a gap between said optical source surface and said optical target surface; and a gas supply interface for infusing a purge gas through said porous frame and into said gap;

wherein said porous frame is comprised of a porous material, wherein the porous material allows transmission of gases and prevents transmission of particle contaminants.

2. The apparatus of claim 1, wherein said gas supply interface comprises a hole in said porous frame through which purge gas enters into said gap.

3. The apparatus of claim 1, wherein said gas supply interface infuses a purge gas into said gap through pores of said porous frame.

4. The apparatus of claim 1, further comprising a vacuum source interface for evacuating said purge gas from said vacuum source interface.

5. The apparatus of claim 4, wherein said vacuum source interface comprises a hole in said porous frame through which said purge gas is evacuated.

6. The apparatus of claim 4, wherein said vacuum source interface evacuates said purge gas from said gap through pores in said porous frame.

7. The apparatus of claim 1, wherein a purge gas pressure in said gap is balanced to equal an atmospheric pressure environment.

8. An apparatus for maintaining a purged optical gap between a pellicle and a reticle in a photolithography system, comprising:

a porous frame defining first and second opposing surfaces, said first opposing surface defining a first opening and being configured to mate with the pellicle and said second opposing surface defining a second opening and being configured to mate with the reticle to enclose the optical gap between the pellicle and the reticle; and a gas supply interface for infusing a purge gas through said porous frame and into said gap;

wherein said porous frame is comprised of a porous material, wherein the porous material allows transmission of gases and prevents transmission of particle contaminants.

9. The apparatus of claim 8, wherein said gas supply interface comprises a hole in said porous frame through which purge gas enters into said gap.

10. The apparatus of claim 8, wherein said gas supply interface infuses a purge gas into said gap through pores of said porous frame.

11. The apparatus of claim 8, further comprising a vacuum source interface for evacuating said purge gas from said vacuum source interface.

12. The apparatus of claim 11, wherein said vacuum source interface comprises a hole in said porous frame through which said purge gas is evacuated.

13. The apparatus of claim 11, wherein said vacuum source interface evacuates said purge gas from said gap through pores in said porous frame.

14. The apparatus of claim 8, where a purge gas pressure in said gap is balanced to equal an atmospheric pressure environment.

15. The apparatus of claim 8, wherein a purge gas pressure greater than an atmospheric pressure environment is maintained in said gap.

16. The apparatus of claim 8, further comprising a gas supply coupled to said gas supply interface.

17. The apparatus of claim 11, further comprising a vacuum source coupled to said vacuum source interface.

18. A photolithography system comprising:

a pellicle;

a reticle in optical alignment with said pellicle;

a frame disposed between said pellicle and said reticle to enclose a gap therebetween, wherein said frame is comprised of a porous material, wherein the porous material allows transmission of gases and prevents transmission of particle contaminants, wherein said frame allows gas to pass from said gap enclosed by said frame to an exterior of said frame; and a gas supply interface coupled to said frame for infusing a purge gas through said frame and into said gap.

19. The system of claim 18, further comprising a vacuum source interface coupled to said frame for evacuating said purge gas from said gap through said frame.

20. A method for maintaining a purged pellicle-to-reticle gap in a photolithography system, comprising:

(a) forming an air gap within a porous frame between a reticle and pellicle, wherein said porous frame is comprised of a porous material, wherein the porous material allows transmission of gases and prevents transmission of particle contaminants; and (b) infusing a purge gas into the air gap through the porous frame.

21. The method of claim 20, wherein step (a) comprises the steps of:

(1) attaching a pellicle to a first open surface of a porous frame; and (2) attaching a reticle to a second open surface of a porous frame to form an air gap within the porous frame between the reticle and the pellicle.

22. The method of claim 20, further comprising the step of:

(c) filtering the infused purge gas with the porous frame.

23. The method of claim 20, wherein said step (b) comprises the step of:

infusing a purge gas into the air gap through an end surface of the porous frame.

24. The method of claim 20, further comprising the step of:

(c) evacuating the purge gas from the air gap.

25. The method of claim 24, wherein step (c) comprises the step of:

evacuating the purge gas from the air gap through an end surface of the porous frame.

26. The method of claim 20, further comprising the step of:

(c) balancing a purge gas pressure in the air gap with an ambient environment air pressure.

27. The method of claim 20, wherein step (b) includes the step of:

(b) infusing a purge gas that is substantially free of oxygen into the air gap through the porous frame.

28. The method of claim 20, wherein step (b) includes the step of:

(b) infusing a purge gas that includes a substantial proportion of nitrogen into the air gap through the porous frame.

* * * * *

UNITED STATES PATENT AND TRADEMARK OFFICE
CERTIFICATE OF CORRECTION

PATENT NO.     : 6,507,390 B1
DATED          : January 14, 2003
INVENTOR(S)    : Jorge Ivaldi It is certified that error appears in the above-identified patent and that said Letters Patent is hereby corrected as shown below:

Title page,
Item [56], References Cited, FOREIGN PATENT DOCUMENTS, please add
-- EP 0 696 760 A1 --
OTHER PUBLICATIONS, please add the following cited references:
-- Patents Abstracts of Japan, Vol. 011, JP 09 197652 A, published July 31, 1997.
Patents Abstracts of Japan, Vol. 015, No. 410 (P-1264), JP 03 166545A, published July 18, 1991.
Patents Abstracts of Japan, Vol. 016, No. 521 (E-1285), JP 04 196117 A, published July 15, 1992.
Patents Abstracts of Japan, Vol. 017, No. 060 (P-1482), JP 04 269752 A, published September 25, 1952.
Patents Abstracts of Japan, Vol. 018, No. 096 (P-1694), JP 05 297572 A, published November 12, 1933.
Copy of International Search Report issued March 19, 2001 for PCT/US00/30432, 7 pages. --

Signed and Sealed this

Seventeenth Day of June, 2003

JAMES E. ROGAN
*Director of the United States Patent and Trademark Office*